US009922872B2

(12) United States Patent
Knapp et al.

(10) Patent No.: US 9,922,872 B2
(45) Date of Patent: Mar. 20, 2018

(54) TUNGSTEN FILMS BY ORGANOMETALLIC OR SILANE PRE-TREATMENT OF SUBSTRATE

(71) Applicant: Applied Materials, Inc., Santa Clara, CA (US)

(72) Inventors: David Knapp, Santa Clara, CA (US); Jeffrey W. Anthis, San Jose, CA (US); Xinyu Fu, Pleasanton, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/151,612

(22) Filed: May 11, 2016

(65) Prior Publication Data

US 2016/0336222 A1   Nov. 17, 2016

Related U.S. Application Data

(60) Provisional application No. 62/160,771, filed on May 13, 2015.

(51) Int. Cl.
*H01L 21/768* (2006.01)
*H01L 23/498* (2006.01)
*H01L 23/532* (2006.01)
*H01L 21/285* (2006.01)

(52) U.S. Cl.
CPC .. *H01L 21/76876* (2013.01); *H01L 21/28562* (2013.01); *H01L 21/76877* (2013.01); *H01L 23/49866* (2013.01); *H01L 23/53266* (2013.01)

(58) Field of Classification Search
CPC ......... H01L 2924/0002; H01L 2924/00; H01L 21/28562; H01L 21/76843; H01L 21/28556; H01L 21/76877; H01L 21/76876; H01L 21/0228; H01L 21/02274; H01L 21/76254; H01L 21/0262
See application file for complete search history.

(56) References Cited

U.S. PATENT DOCUMENTS

| | | | |
|---|---|---|---|
| 5,422,308 A * | 6/1995 | Nicholls | H01L 21/76877 257/E21.585 |
| 6,827,978 B2 | 12/2004 | Yoon et al. | |
| 7,655,567 B1 * | 2/2010 | Gao | C23C 16/0281 257/750 |
| 9,484,251 B1 * | 11/2016 | Besser | H01L 21/2236 |
| 2002/0048880 A1 | 4/2002 | Lee | |
| 2002/0076507 A1 | 6/2002 | Chiang et al. | |
| 2002/0162506 A1 | 11/2002 | Sneh et al. | |
| 2003/0049942 A1 | 3/2003 | Haukka et al. | |
| 2007/0087560 A1 * | 4/2007 | Kwak | H01L 21/28556 438/637 |

(Continued)

OTHER PUBLICATIONS

International Search Report and Written Opinion in PCT/US2016/031839 dated Jul. 29, 2016, 13 pages.

(Continued)

*Primary Examiner* — Jaehwan Oh
(74) *Attorney, Agent, or Firm* — Servilla Whitney LLC

(57) ABSTRACT

Processing methods comprising exposing a substrate to a nucleation promoter followed by sequential exposure of a first reactive gas comprising a metal-containing compound and a second reactive gas to form a metal-containing film on the substrate.

18 Claims, 2 Drawing Sheets

(56) References Cited

U.S. PATENT DOCUMENTS

| | | | |
|---|---|---|---|
| 2013/0168864 A1* | 7/2013 | Lee | C23C 16/0281 257/753 |
| 2013/0171822 A1* | 7/2013 | Chandrashekar | H01L 21/28556 438/675 |
| 2014/0030889 A1* | 1/2014 | Chen | C23C 16/0245 438/675 |
| 2014/0120723 A1* | 5/2014 | Fu | H01L 21/28506 438/680 |
| 2014/0349477 A1* | 11/2014 | Chandrashekar | H01L 21/76877 438/627 |
| 2015/0024592 A1* | 1/2015 | Chandrashekar | H01L 21/67207 438/675 |
| 2015/0037972 A1* | 2/2015 | Danek | C23G 5/00 438/643 |

OTHER PUBLICATIONS

PCT International Preliminary Report on Patentability in PCT/US2016/031839 dated Nov. 23, 2017, 9 pages.

* cited by examiner

TUNGSTEN FILMS BY ORGANOMETALLIC OR SILANE PRE-TREATMENT OF SUBSTRATE

CROSS-REFERENCE TO RELATED APPLICATIONS

This application claims priority to U.S. Provisional Application No. 62/160,771, filed May 13, 2015, the entire disclosure of which is hereby incorporated by reference herein.

FIELD

Embodiments of the disclosure relate to the processing of semiconductor substrates. More particularly, embodiments of the disclosure relate to methods for the deposition of tungsten or tungsten-containing films on semiconductor substrates using substrate pre-treatment.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow techniques to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

Due to the increasing integration of semiconductor circuitry, tungsten has been used based upon superior step coverage. As a result, deposition of tungsten employing CVD techniques enjoys wide application in semiconductor processing due to the high throughput of the process. Depositing tungsten by conventional CVD methods, however, is attendant with several disadvantages. For example, ALD processes deposit tungsten films into vias containing high aspect ratios (e.g., 20), whereas conventional CVD processes will usually cause similar vias to "pinch-off" and not completely fill. Additionally, tungsten does not readily adhere to some surfaces (e.g., dielectric spacers or oxides). To increase the adhesion of tungsten to dielectric spacers, conventional processes include a TiN layer. The deposition of the TiN film as a seed layer can be time consuming and adds additional complexity to the overall process.

Therefore, there is a need in the art for improved techniques to deposit tungsten layers with good conformality.

SUMMARY

One or more embodiments of the disclosure are directed to processing methods comprising exposing a substrate to a nucleation promoter followed by sequential exposure of a first reactive gas comprising a metal-containing compound and a second reactive gas to form a metal-containing film on the substrate.

Additional embodiments of the disclosure are directed to processing methods comprising positioning a substrate having a dielectric surface in a processing chamber. The dielectric surface is treated with a nucleation promoter. At least a portion of the treated dielectric surface is sequentially exposed to a first reactive gas and a second reactive gas to form a tungsten film. The first reactive gas comprises a tungsten-containing compound and the second reactive gas comprises hydrogen.

Further embodiments of the disclosure are directed to processing methods comprising positioning a substrate having a dielectric surface in a processing chamber. The dielectric surface is treated with a nucleation promoter selected from the group consisting of trialkylaluminum, trialkylgallium, trialkylindium, disilane, trisilane, tetrasilane, diethylsilane, derivatives thereof and combinations thereof. At least a portion of the treated dielectric surface is sequentially exposed to a first reactive gas and a second reactive gas to form a tungsten film. The first reactive gas comprises one or more halogenated tungsten compounds and substantially no fluorine and the second reactive gas comprises hydrogen. The temperature of the substrate during treatment with the nucleation promoter is substantially the same as the temperature of the substrate during the exposure to the first reactive gas and the second reactive gas. The tungsten-containing compound has substantially no nucleation on the dielectric without treatment with the nucleation promoter.

Additional embodiments of the disclosure are directed to integrated circuit transistor devices comprising a dielectric layer disposed over a channel, a discontinuous seed layer comprising a nucleation promotor and a fill layer disposed over the dielectric layer. The seed layer has an average thickness less than or equal to about 1 Å and the fill layer consists essentially of W.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1:
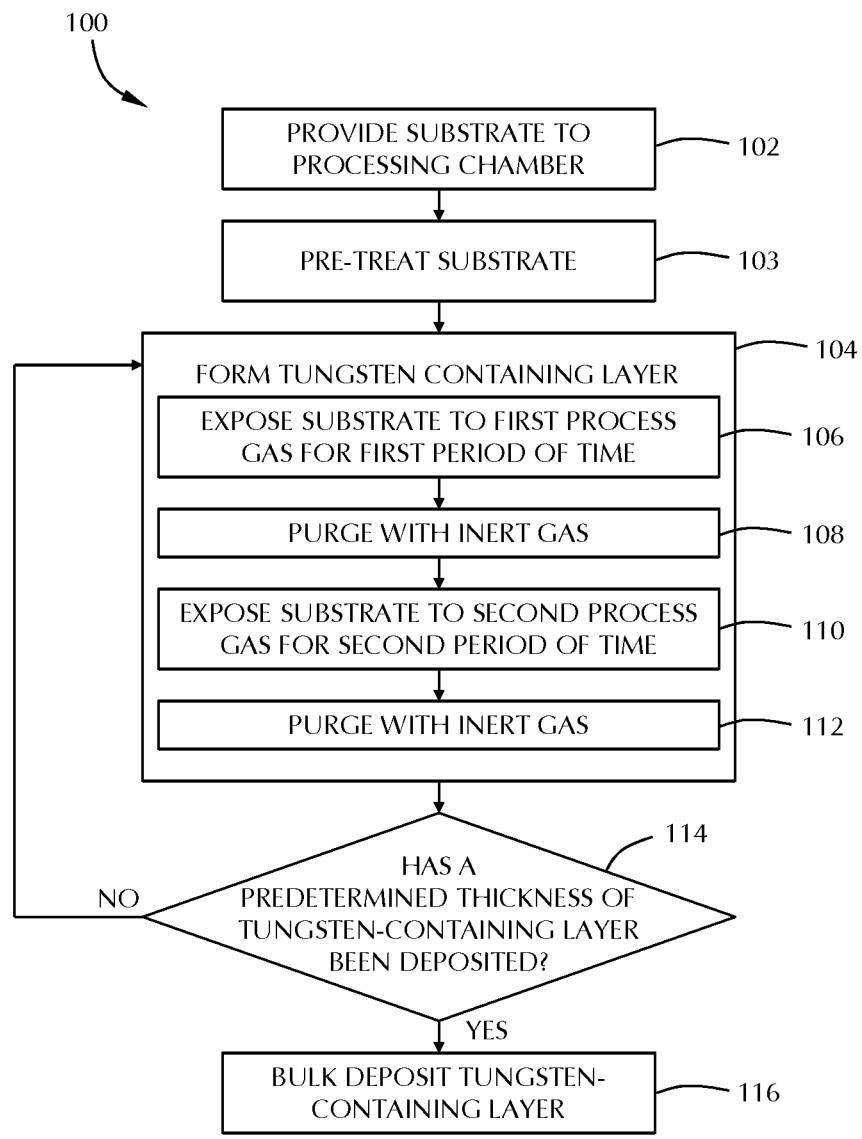
FIG. 1 illustrates an exemplary process sequence for the formation of a tungsten layer using a two pulse cyclical deposition technique according to one or more embodiment of the disclosure.

Embodiments of the disclosure provide an improved process for depositing tungsten-containing films. The process of various embodiments uses vapor deposition techniques, such as an atomic layer deposition (ALD) to provide tungsten films having significantly improved surface uniformity and production level throughput. In some embodiments, the process allows the tungsten-containing film to be deposited onto a dielectric material without a seed layer. In some embodiments, the methods increase productivity and efficiency of processing semiconductor substrates by providing conformal deposition of tungsten-containing films onto oxide and/or dielectric surface without significant incubation delay.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. A substrate surface may also include dielectric materials such as silicon dioxide and carbon doped silicon oxides. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure are described with respect to the formation of a tungsten-containing layer. This is merely for descriptive purposes and those skilled in the art will understand that the embodiments are not limited to tungsten.

FIG. 1 depicts a method for forming a tungsten-containing layer, or film, on a substrate in accordance with some embodiments of the disclosure. The method 100 generally begins at 102, where a substrate, having a surface upon which a tungsten-containing layer is to be formed is provided and placed into a processing chamber. As used herein, a "substrate surface" refers to any substrate surface upon which a layer may be formed. The substrate surface may have one or more features formed therein, one or more layers formed thereon, and combinations thereof.

The substrate is exposed to a pre-treatment process at 103 prior to beginning the formation of the metal-containing film. The pre-treatment process comprises exposing the substrate to a nucleation promoter. The nucleation promoter can be any suitable compound that can treat the surface of the substrate to increase the nucleation of the metal film being formed. As used in this regard, increasing nucleation means that the nucleation rate of the metal film on the treated substrate is at least twice that of an untreated substrate. In some embodiments, the nucleation promoter is selected from the group consisting of trimethylaluminum, disilane, trisilane, tetrasilane, diethylsilane, derivatives thereof and combinations thereof. In one or more embodiments, the nucleation promoter comprises one or more of a trialkyaluminum (e.g., trimethylaluminum, triethylaluminum, ethyldimethylaluminum, etc), trialkylgallium (e.g., trimethylgallium, triethylgallium, etc.), trialkylindium (e.g., trimethylindium, triethylindium, etc.) disilane, trisilane and/or tetrasilane.

Without being bound to any particular theory of operation, it is believed that the nucleation promoter treats the substrate surface to reduce the amount of oxide, or other blocking substituent, on the surface of the substrate. As the nucleation promoter allows the formation of a film, the nucleation promoter may be analogous to or act like a seed layer. The "seed layer" of some embodiments does not form a continuous film on the substrate. Stated differently, the nucleation promotor may act like a seed layer for the formation of the metal-containing (e.g., tungsten-containing) film while being discontinuous. The average thickness of the seed layer is generally less than or equal to about 2.5 Å, 2.0 Å, 1.5 Å, 1.0 Å or 0.8 Å. As the seed layer is often discontinuous, there will likely be portions of the substrate surface that have no seed layer, and domains with a seed layer greater than 2.5 Å.

The nucleation promoter can be exposed to the substrate surface in pulses or as a soak. A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds. Soaking the surface is exposing the surface to a relatively long pulse or continuous flow of the nucleation promoter.

The process chamber may be purged of any unreacted or unused nucleation promotor. Such a purge would be similar to that described below with respect to 108. However, in some embodiments, the flow of the nucleation promotor is simply stopped prior to, with, or after, the onset of the film formation at 104.

Next, at 104, a metal-containing layer, referred to in the Figure as a tungsten-containing layer is formed on the substrate. Again, the use of a tungsten-containing layer is for descriptive purposes and is merely representative of some embodiments of the disclosure. The disclosure is not limited to tungsten-containing materials. The metal-containing layer may be formed via a chemical vapor deposition (CVD) process or a cyclical deposition process, such as atomic layer deposition (ALD), or the like. The CVD process provides or creates a mixture of the first reactive gas and the second reactive gas in the processing chamber. There are no intervening purges between the reactions of the first and second reactive gases. For descriptive purposes, an ALD process is described in FIG. 1 and herein. Those skilled in the art will understand that the CVD process is included in this disclosure.

In some embodiments, the forming of a tungsten-containing layer via a cyclical deposition process may generally comprise exposing the substrate to two or more process gases sequentially. In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases. The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any of the embodiments described above for both time-domain ALD and spatial ALD processes, the sequences may be repeated until a desired layer thickness is formed on the substrate surface.

The process of forming the metal- or tungsten-containing layer at 104 may begin by exposing the substrate to a first reactive gas comprising a metal-containing compound. The flowchart of FIG. 1 refers to a first process gas and second process gas. As used herein, the terms "reactive gas", "process gas", "precursor", and the like, are used interchangeably. In some embodiments, the metal-containing compound in the first reactive gas comprises a tungsten-containing compound and is exposed to the substrate for a first period of time, as shown at 106.

The metal-containing precursor can have any suitable metal for deposition on the substrate surface. In some embodiments, the first reactive gas comprises a metal that does not nucleate on the dielectric without the nucleation promoter. As used in this specification and the appended claims, the term "does not nucleate" means that the nucleation rate on a dielectric surface not exposed to the nucleation promoter is less than half the nucleation rate on a treated surface. The tungsten precursor can be any suitable tungsten-containing compound including, but not limited to, halide based tungsten precursors and/or organometallic tungsten precursors. For example, in some embodiments, the tungsten precursor may comprise one or more of tungsten pentachloride ($WCl_5$), compounds with the empirical formula of $WCl_5$ (e.g., $W_2Cl_{10}$, $W_3Cl_{15}$), tungsten hexachloride ($WCl_6$), compounds with the empirical formula of $WCl_6$ (e.g., $W_2Cl_{12}$), bromides of tungsten, iodides of tungsten, mixed halogenated tungsten and combinations thereof. In some embodiments, the tungsten-containing compound comprises a compound with the empirical formula $W_xCl_{5x}$, where x is greater than or equal to about 1 and y is greater than or equal to about 5. In some embodiments, the metal-containing compound, or the tungsten-containing compound, comprises substantially no fluorine. As used in this specification and the appended claims, the term "substantially no fluorine", and the like, means that there is less than about 5%, 4%, 3%, 2%, 1%, 0.5% or 0.1% fluorine atoms on an atomic basis.

In some embodiments, an inert gas may additionally be provided to the process chamber at the same time as the metal-containing gas. The inert gas may be mixed with the metal-containing gas (e.g., as a diluent gas) or separately and can be pulsed or of a constant flow.

In some embodiments, the nucleation promoter is provided into the processing chamber with the first reactive gas instead of, or in addition to, the separate pre-treatment process of 103. If the nucleation promoter is provided with the first reactive gas, it may only be included for up to about the 15th process cycle.

Next, at 108, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas at 106. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased.

The flow of inert gas may facilitate removing any excess first process gas components and/or excess reaction byproducts from the process chamber to prevent unwanted gas phase reactions of the first and second process gases. For example, the flow of inert gas may remove excess tungsten-containing gas from the process chamber, preventing a reaction between the tungsten precursor and a subsequent reactive gas.

Next, at 110, the substrate is exposed to a second process gas, also referred to as a second reactive gas, for a second period of time. The second process gas reacts with the metal-containing compound on the substrate surface to create a deposited film. In some embodiments, the second reactive gas comprises hydrogen and the resulting film formed is a tungsten film or metal film. In some embodiments, the second reactive gas comprises a hydrogen-containing compound and the hydrogen-containing compound consists essentially of molecular hydrogen. As used in this regard, the term "consisting essentially of molecular hydrogen" means that active portion (i.e., non-inert species) of the second reactive gas is greater than or equal to about 95%, 98%, 99% or 99.5% hydrogen. As used in this regard, "molecular hydrogen" comprises one or more of $H_2$, radicals of hydrogen and/or hydrogen ions.

Next, at 112, the process chamber may be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased.

While the generic embodiment of the processing method shown in FIG. 1 includes only two pulses of reactive gases, it will be understood that this is merely exemplary and that additional pulses of reactive gases may be used. For example, a nitride film of some embodiments can be grown by a first pulse containing a precursor gas like tungsten pentachloride, a second pulse with a reducing agent followed by purging and a third pulse for nitridation. The pulses can be repeated in their entirety or in part. For example all three pulses could be repeated or only two can be repeated. This can be varied for each cycle as desired.

Next, at 114, it is determined whether the metal-containing layer has achieved a predetermined thickness. If the predetermined thickness has not been achieved, the method 100 returns to 104 to continue forming the layer until the predetermined thickness is reached. Once the predetermined thickness has been reached, the method 100 can either end or proceed to 116 where a bulk deposition process may be performed to deposit the remaining thickness of the tungsten-containing layer. In some embodiments, the bulk deposition process may be a CVD process. Upon completion of deposition of the tungsten-containing layer to a desired thickness, the method 100 generally ends and the substrate can proceed for any further processing. For example, in some embodiments, a CVD process may be performed to bulk deposit the tungsten-containing layer to a target thickness. For example in some embodiments, the tungsten-containing layer may be deposited via ALD or CVD reaction of the tungsten precursor and hydrogen radicals to form a total layer thickness of about 10 to about 10,000 Å, or in some embodiments, about 10 to about 1000 Å, or in some embodiments, about 500 to about 5,000 Å.

The metal-containing film formed in some embodiments consists essentially of the first metal. As used in this regard, the term "consisting essentially of the first metal" means that the bulk portion of the film is greater than about 80%, 85%, 90%, 95% or 98% of the metal in the first reactive gas on an atomic basis. The bulk portion of the film excludes the interface regions immediately adjacent the substrate and the surface of the layer which may oxidize. In some embodiments, the metal-containing film consists essentially of tungsten.

The temperature throughout the process of FIG. 1, up to, and in some embodiments including, the bulk deposition at 116, occurs at substantially the same temperature. As used in this regard, the term "substantially the same temperature" means that the substrate temperature remains within ±50° C., ±25° C., ±15° C., ±10° C. or ±5° C. during exposure of each of the nucleation promoter, the first reactive gas and the second reactive gas. Thus, the pretreatment and deposition processes of 103 and 104 can occur without changing processing chamber or processing conditions. The processing temperature can be any suitable temperature. In some embodiments, the process temperature is in the range of about 50° C. to about 650° C. In one or more embodiments, the process temperature during at least the exposure to the nucleation promoter is less than about 500° C., 450° C., 400° C., 350° C., 300° C., 250° C., 200° C., 150° C. or 100° C.

Some embodiments of the disclosure are directed to integrated circuit transistor devices comprising a dielectric layer disposed over a channel, a discontinuous seed layer comprising a nucleation promotor on the dielectric layer. The seed layer having an average thickness less than or equal to about 1.5 Å or 1.0 Å. A fill layer is disposed over the dielectric layer. In some embodiments, the fill layer consists essentially of a substantially pure (greater than about 90 atomic %) metal. In some embodiments, the fill layer consists essentially of tungsten.

Some embodiments of the disclosure are directed to tungsten containing films. These film include, tungsten metal films, tungsten nitrides, silicide and tungsten silicon nitride. The tungsten containing films can be used for any number of suitable purposes including, but not limited to, p-metal work function layers and fill materials.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

EXAMPLES

Figure 2:
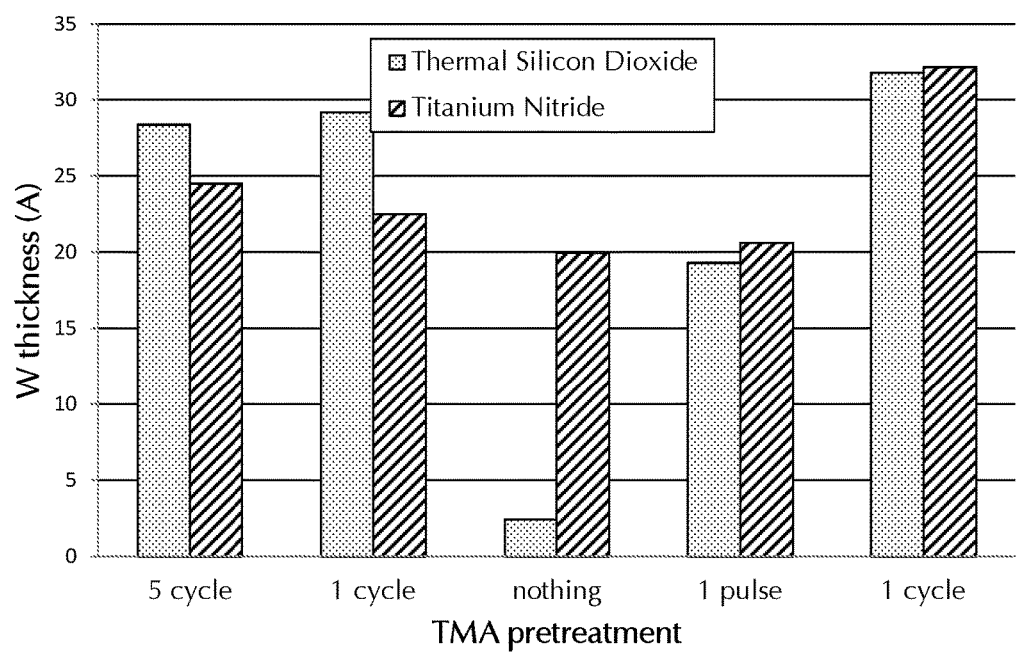
FIG. 2 shows an graph of the film thickness of samples prepared in accordance with one or more embodiment of the disclosure.

Silicon dioxide films were grown by thermal oxidation process. $SiO_2$ films and TiN films were simultaneously subjected to either: no pretreatment, 1 pulse of trimethylaluminum, 1 cycle of trimethylaluminum or 5 cycles of trimethylaluminum. A pulse was a brief emission of a single nucleation promoter into the processing chamber followed by a purge. A cycle was alternating pulses of tungsten pentachloride and either a nucleation agent or hydrogen, separated by a purge time that is longer than the pulse. Each cycle has two pulses. After pre-treatment, each sample was exposed to 350 ALD cycles of $WCl_5/H_2$ at about 467° C. The thickness of the deposited film was determined by X-ray fluorescence (XRF) and the results are shown in FIG. 2. The data in FIG. 2 shows that the samples without pre-treatment had substantially no nucleation of the tungsten film while the pre-treated samples show much higher nucleation rates. Two samples with one cycle were prepared. The data in FIG. 2 also show that the thermal silicon oxide samples without pretreatment had substantially no nucleation of the tungsten film, while the pre-treated thermal silicon oxide samples show much higher nucleation rates that are comparable to the nucleation on titanium nitride.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising exposing a substrate to a nucleation promoter followed by sequential exposure of a first reactive gas comprising a metal-containing compound and a second reactive gas to form a metal-containing film on the substrate, wherein the nucleation promoter is selected from the group consisting of trialkylaluminum, trialkylgallium, trialkylindium, diethylsilane, derivatives thereof and combinations thereof.

2. The method of claim 1, wherein the metal-containing compound comprises one or more of a halogenated tungstens and/or organometallic tungstens.

3. The method of claim 2, wherein the metal-containing compound comprises substantially no fluorine.

4. The method of claim 1, wherein second reactive gas comprises a hydrogen-containing compound and the tungsten-containing film is a tungsten film.

5. The method of claim 4, wherein the hydrogen-containing compound consists essentially of molecular hydrogen.

6. The method of claim 1, wherein the metal-containing film consists essentially of tungsten.

7. The method of claim 1, wherein the substrate temperature remains substantially the same during exposure of each of the nucleation promoter, the first reactive gas and the second reactive gas.

8. The method of claim 1, wherein the substrate comprises a dielectric.

9. The method of claim 8, wherein the first reactive gas comprises a metal that does not nucleate on the dielectric without the nucleation promoter.

10. The method of claim 9, wherein the nucleation promotor acts like a seed layer for the formation of the metal-containing film, the seed layer having an average thickness less than or equal to about 1.5 Å.

11. The method of claim 1, wherein exposure to the nucleation promoter occurs substantially simultaneously with a first exposure to the metal-containing compound.

12. A processing method comprising
positioning a substrate having a dielectric surface in a processing chamber;
treating the dielectric surface with a nucleation promoter selected from the group consisting of trialkylaluminum, trialkylgallium, trialkylindium, diethylsilane, derivatives thereof and combinations thereof; and
sequentially exposing at least a portion of the treated dielectric surface to a first reactive gas and a second reactive gas to form a tungsten film, the first reactive gas comprising a tungsten-containing compound and the second reactive gas comprises hydrogen.

13. The method of claim 12, wherein the tungsten-containing compound comprises one or more halogenated tungsten compounds and substantially no fluorine.

14. The method of claim 12, wherein the temperature of the substrate during treatment with the nucleation promoter is substantially the same as the temperature of the substrate during the exposure to the first reactive gas and the second reactive gas.

15. The method of claim 12, wherein the tungsten-containing compound has substantially no nucleation on the dielectric without treatment with the nucleation promoter.

16. The method of claim 12, wherein the nucleation promotor acts like a seed layer for the formation of the tungsten-containing film, the seed layer having an average thickness less than or equal to about 1 Å.

17. The method of claim 12, wherein exposure to the nucleation promoter occurs substantially simultaneously with a first exposure to the metal-containing compound.

18. A processing method comprising
positioning a substrate having a dielectric surface in a processing chamber;
treating the dielectric surface with a nucleation promoter selected from the group consisting of trialkylaluminum, trialkylgallium, trialkylindium, diethylsilane, derivatives thereof and combinations thereof; and sequentially exposing at least a portion of the treated dielectric surface to a first reactive gas and a second reactive gas to form a tungsten film, the first reactive gas comprising one or more halogenated tungsten compounds and substantially no fluorine and the second reactive gas comprises hydrogen, wherein the temperature of the substrate during treatment with the nucleation promoter is substantially the same as the temperature of the substrate during the exposure to the first reactive gas and the second reactive gas, and the tungsten-containing compound has substantially no nucleation on the dielectric without treatment with the nucleation promoter.

* * * * *